(12) United States Patent
Elghannai et al.

(10) Patent No.: US 11,355,834 B2
(45) Date of Patent: Jun. 7, 2022

(54) EAR-WORN ELECTRONIC DEVICE INCORPORATING AN ANTENNA SUBSTRATE COMPRISING A DIELECTRIC GEL OR LIQUID

(71) Applicant: Starkey Laboratories, Inc., Eden Prairie, MN (US)

(72) Inventors: Ezdeen Elghannai, Eden Prairie, MN (US); Zhenchao Yang, Eden Prairie, MN (US); Stephen P. Flood, Eden Prairie, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 298 days.

(21) Appl. No.: 16/703,308

(22) Filed: Dec. 4, 2019

(65) Prior Publication Data

US 2020/0251811 A1  Aug. 6, 2020

Related U.S. Application Data

(60) Provisional application No. 62/802,010, filed on Feb. 6, 2019.

(51) Int. Cl.
  *H04R 25/00* (2006.01)
  *H01Q 1/38* (2006.01)
  *H05K 1/03* (2006.01)

(52) U.S. Cl.
  CPC ............. *H01Q 1/38* (2013.01); *H04R 25/554* (2013.01); *H05K 1/0306* (2013.01); *H04R 2225/51* (2013.01)

(58) Field of Classification Search
  CPC .......... H04R 1/406; H04R 1/04; H04R 1/083; H04R 1/1016; H04R 5/033; H04R 1/1041; H04R 27/00; H04R 19/016; H04R 2420/07
  See application file for complete search history.

(56) References Cited

U.S. PATENT DOCUMENTS

| | | |
|---|---|---|
| 6,891,501 B2 | 5/2005 | Rawnick et al. |
| 7,023,392 B2 | 4/2006 | Brown et al. |
| 7,773,044 B2 | 8/2010 | Oksanen et al. |

(Continued)

FOREIGN PATENT DOCUMENTS

WO  2018/180035  10/2018

OTHER PUBLICATIONS

International Search Report and Written Opinion from PCT Application No. PCT/US2020/013860 dated Apr. 7, 2020, 16 pages.

(Continued)

*Primary Examiner* — Amir H Etesam
(74) *Attorney, Agent, or Firm* — Mueting Raasch Group

(57) ABSTRACT

An ear-worn electronic device is configured to be worn by a wearer and comprises a housing configured to be supported at, by, in or on the wearer's ear. A processor is disposed in the housing. A speaker or a receiver is operably coupled to the processor. A radio frequency transceiver is disposed in the housing and operably coupled to the processor. An antenna is disposed on or in the housing and operably coupled to the transceiver. The antenna comprises a radiating element, a ground plane, and a substrate disposed between the radiating element and the ground plane. The substrate comprises one or both of a dielectric gel and a dielectric liquid.

23 Claims, 8 Drawing Sheets

(56) References Cited

U.S. PATENT DOCUMENTS

| | | |
|---|---|---|
| 8,970,439 B2 | 3/2015 | Maxwell |
| 9,046,405 B2 | 6/2015 | Rike |
| 9,960,493 B2 | 5/2018 | Luk et al. |
| 10,165,376 B2 | 12/2018 | Vajha et al. |
| 10,284,975 B2 | 5/2019 | Higgins et al. |
| 2008/0056520 A1* | 3/2008 | Christensen ......... H04R 25/554 381/323 |
| 2008/0143619 A1 | 6/2008 | Wotherspoon |
| 2011/0316539 A1 | 12/2011 | Lagendijk et al. |
| 2012/0280870 A1* | 11/2012 | Maxwell ................. H01Q 1/38 343/745 |
| 2013/0188812 A1* | 7/2013 | Tinaphong ........... H04R 25/554 381/315 |
| 2014/0306846 A1* | 10/2014 | Nakatsu ................ H01Q 21/29 343/700 MS |
| 2016/0183013 A1 | 6/2016 | Polinske et al. |
| 2018/0124528 A1* | 5/2018 | Polinske ............. H04R 25/554 |
| 2018/0221673 A1 | 8/2018 | Kuang |

OTHER PUBLICATIONS

Orban et al., "The Basic of Patch Antennas, Updated", RF Globalnet newsletter, Sep. 29, 2009, 20 pages.

* cited by examiner

EAR-WORN ELECTRONIC DEVICE INCORPORATING AN ANTENNA SUBSTRATE COMPRISING A DIELECTRIC GEL OR LIQUID

RELATED PATENT DOCUMENTS

This application claims the benefit of Provisional Patent Application Ser. No. 62/802,010 filed on Feb. 6, 2019, to which priority is claimed pursuant to 35 U.S.C. § 119(e), and which is incorporated herein by reference in its entirety.

TECHNICAL FIELD

This application relates generally to ear-worn electronic devices, including hearing devices, hearing aids, personal amplification devices, and other hearables.

BACKGROUND

Hearing devices provide sound for the wearer. Some examples of hearing devices are headsets, hearing aids, speakers, cochlear implants, bone conduction devices, and personal listening devices. For example, hearing aids provide amplification to compensate for hearing loss by transmitting amplified sounds to a wearer's ear canals. Hearing devices may be capable of performing wireless communication with other devices, such as receiving streaming audio from a streaming device via a wireless link. Wireless communication may also be performed for programming the hearing device and transmitting information from the hearing device. For performing such wireless communication, hearing devices such as hearing aids can include a wireless transceiver and an antenna.

SUMMARY

Embodiments are directed to an ear-worn electronic device configured to be worn by a wearer and comprising a housing configured to be supported at, by, in or on the wearer's ear. A processor is disposed in the housing. A speaker or a receiver is operably coupled to the processor. A radio frequency transceiver is disposed in the housing and operably coupled to the processor. An antenna is disposed on or in the housing and operably coupled to the transceiver. The antenna comprises a radiating element, a ground plane, and a substrate disposed between the radiating element and the ground plane. The substrate comprises one or both of a dielectric gel and a dielectric liquid.

Embodiments are directed to an ear-worn electronic device configured to be worn by a wearer and comprising a housing configured for at least partial insertion into an ear canal of the wearer. The housing has a preformed shape that conforms to a shape of the wearer's ear canal. A processor is disposed in the housing. A speaker or a receiver is operably coupled to the processor. A radio frequency transceiver is disposed in the housing and operably coupled to the processor. An antenna is operably coupled to the transceiver. The antenna comprises a radiating element, a ground plane, and a substrate disposed between the radiating element and the ground plane. The substrate comprises one or both of a dielectric gel and a dielectric liquid.

Embodiments are directed to an ear-worn electronic hearing device configured to be worn by a wearer and comprising a patch-type antenna. The antenna comprises a radiating element, a ground plane, and a substrate disposed between the radiating element and the ground plane. The substrate comprises one or both of a dielectric gel and a dielectric liquid.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
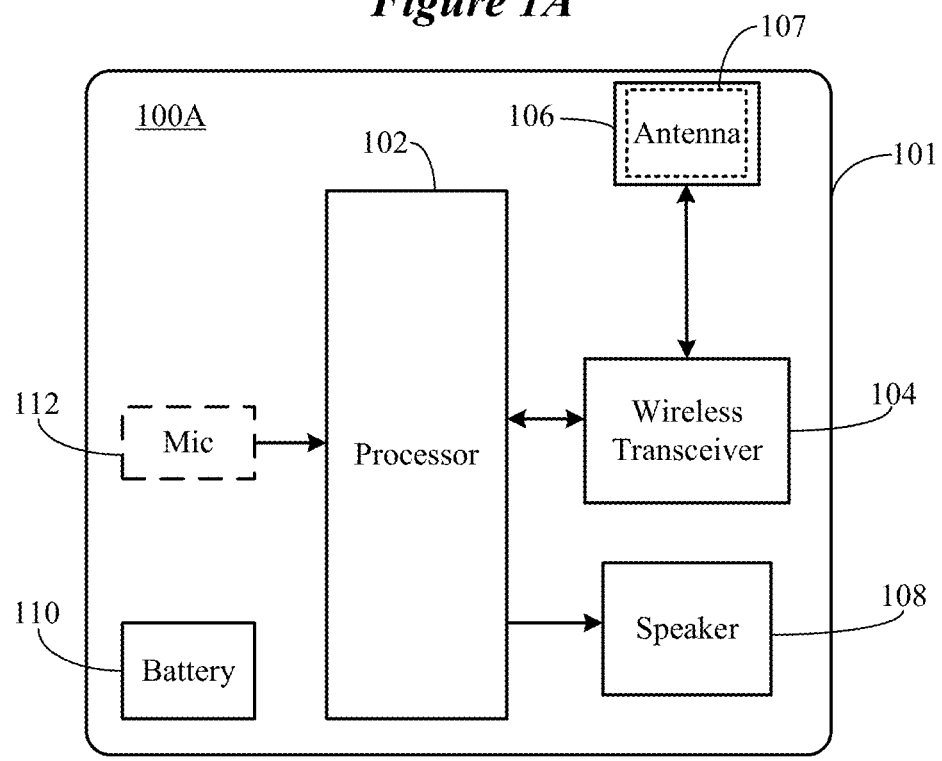
FIGS. 1A and 1B illustrate an ear-worn electronic device arrangement incorporating an antenna which includes a substrate comprising a dielectric gel and/or a dielectric fluid in accordance with various embodiments.

It is understood that the embodiments described herein may be used with any ear-worn or ear-level electronic device without departing from the scope of this disclosure. The devices depicted in the figures are intended to demonstrate the subject matter, but not in a limited, exhaustive, or exclusive sense. Ear-worn electronic devices (also referred to herein as "hearing devices"), such as hearables (e.g., wearable earphones, ear monitors, and earbuds), hearing aids, hearing instruments, and hearing assistance devices, typically include an enclosure, such as a housing or shell, within which internal components are disposed. Typical components of a hearing device can include a processor (e.g., a digital signal processor or DSP), memory circuitry, power management circuitry, one or more communication devices (e.g., a radio, a near-field magnetic induction (NFMI) device), one or more antennas, one or more microphones, and a receiver/speaker, for example. Hearing devices can incorporate a long-range communication device, such as a Bluetooth® transceiver or other type of radio frequency (RF) transceiver. A communication device (e.g., a radio or NFMI device) of a hearing device can be configured to facilitate communication between a left ear device and a right ear device of the hearing device.

Hearing devices of the present disclosure can incorporate an antenna coupled to a high-frequency transceiver, such as a 2.4 GHz radio. The RF transceiver can conform to an IEEE 802.11 (e.g., WiFi®) or Bluetooth® (e.g., Bluetooth® Low Energy (BLE), Bluetooth® 4.2, 5.0, 5.1, 5.2 or later) specification, for example. It is understood that hearing devices of the present disclosure can employ other transceivers or radios, such as a 900 MHz radio. Hearing devices of the present disclosure can be configured to receive streaming audio (e.g., digital audio data or files) from an electronic or digital source. Representative electronic/digital sources (e.g., accessory devices) include an assistive listening system, a TV streamer, a radio, a smartphone, a laptop, a cell phone/entertainment device (CPED) or other electronic device that serves as a source of digital audio data or other types of data files. Hearing devices of the present disclosure can be configured to effect bi-directional communication (e.g., wireless communication) of data with an external source, such as a remote server via the Internet or other communication infrastructure. Hearing devices that include a left ear device and a right ear device can be configured to effect bi-directional communication (e.g., wireless communication) therebetween, so as to implement ear-to-ear communication between the left and right ear devices.

The term hearing device of the present disclosure refers to a wide variety of ear-level electronic devices that can aid a person with impaired hearing. The term hearing device also refers to a wide variety of devices that can produce processed sound for persons with normal hearing. Hearing devices of the present disclosure include hearables (e.g., wearable earphones, headphones, earbuds, virtual reality headsets), hearing aids (e.g., hearing instruments), cochlear implants, and bone-conduction devices, for example. Hearing devices include, but are not limited to, behind-the-ear (BTE), in-the-ear (ITE), in-the-canal (ITC), invisible-in-canal (IIC), receiver-in-canal (RIC), receiver-in-the-ear (RITE) or completely-in-the-canal (CIC) type hearing devices or some combination of the above. Throughout this disclosure, reference is made to a "hearing device," which is understood to refer to a system comprising a single left ear device, a single right ear device, or a combination of a left ear device and a right ear device.

Ear-worn electronic devices configured for wireless communication, such as hearing aids and other types of hearing devices, are relatively small in size. Custom hearing devices, such as ITE, ITC, and CIC devices for example, are quite small in size. In the manufacture of a custom hearing device, for example, an ear impression or ear mold is taken for a particular wearer and processed to construct the housing of the hearing device. Because custom hearing devices are designed to be partially or fully inserted into a wearer's ear canal, the housing is necessarily quite small. In order to implement a functional wireless platform (e.g., @ 2.4 GHz), the antenna must be small enough to fit within such devices.

The severe space limitations within the housing of an ear-worn electronic device impose a physical challenge on designing the antenna. One approach to address this challenge is to implement an antenna with a high relative dielectric constant (or relative permittivity) to reduce the antenna size. The relative dielectric constant, which is a parameter commonly used to characterize the antenna substrate, may not be as high as needed, particularly in the case of custom hearing devices. Previous attempts to solve this challenge for 2.4 GHz hearing devices, for example, suffer from unacceptably low antenna efficiency due the restriction in antenna size.

In the following discussion, the term dielectric constant will be used as a substitute for the term relative dielectric constant for purposes of brevity. It is understood that the term dielectric constant as used herein is interchangeable with the term relative permittivity.

Embodiments of the disclosure are directed to an antenna of a hearing device which includes a substrate comprising a dielectric gel and/or a dielectric liquid. Incorporating a dielectric gel and/or a dielectric liquid into the substrate of the antenna provides for an antenna substrate with a dielectric constant which is significantly higher than that of a conventional solid antenna substrate. Incorporating a dielectric gel and/or a dielectric liquid within the antenna substrate provides for an antenna with a high dielectric constant that improves radiation efficiency of the antenna while maintaining a small size. Incorporating a dielectric gel and/or a dielectric liquid into the substrate of the antenna provides increased flexibility in the design and layout for achieving enhanced antenna performance (e.g., higher radiation efficiency and/or wider bandwidth). For example, a dielectric gel and/or a dielectric liquid can be formulated and distributed within the antenna substrate to tune and/or optimize the antenna performance for different hearing device wearers. Particular embodiments are directed to a patch-type antenna of a hearing device (e.g., a custom hearing device) which incorporates a substrate comprising a dielectric gel and/or a dielectric liquid.

Figure 1B:
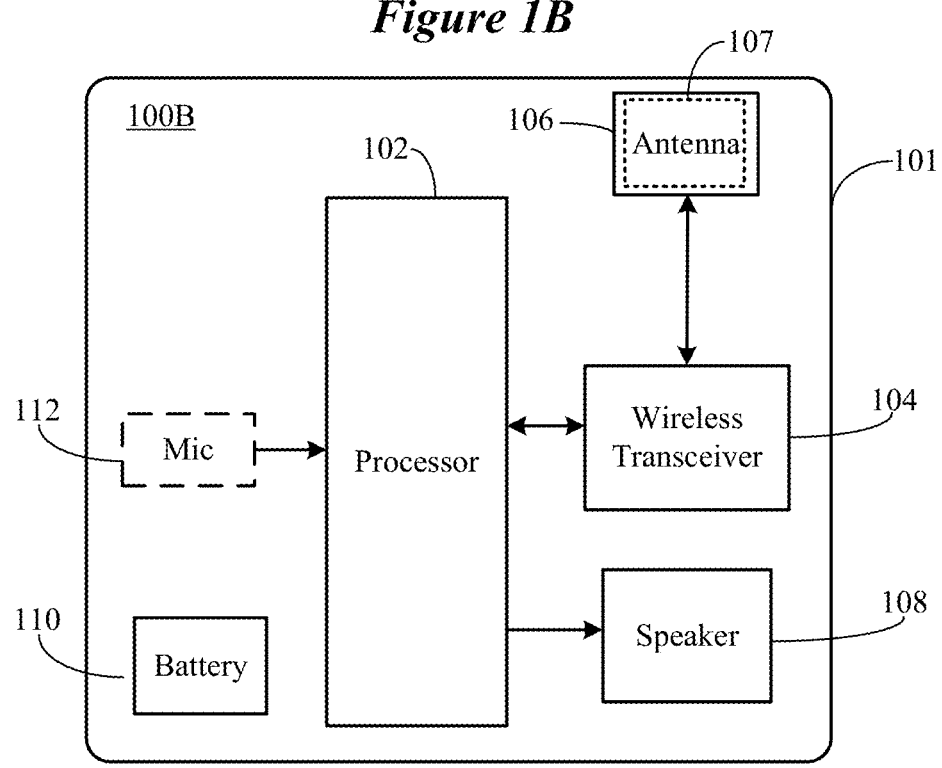

FIGS. 1A and 1B illustrate various components of a representative hearing device arrangement in accordance with various embodiments. FIGS. 1A and 1B illustrate first and second hearing devices 100A and 100B configured to be supported at, by, in or on left and right ears of a wearer. In some embodiments, a single hearing device 100A or 100B can be supported at, by, in or on the left or right ear of a wearer. As illustrated, the first and second hearing devices 100A and 100B include the same functional components. It is understood that the first and second hearing devices 100A and 100B can include different functional components. The first and second hearing devices 100A and 100B can be representative of any of the hearing devices disclosed herein.

The first and second hearing devices 100A and 100B include an enclosure 101 configured for placement, for example, over or on the ear, entirely or partially within the external ear canal (e.g., between the pinna and ear drum) or behind the ear. Disposed within the enclosure 101 is a processor 102 which incorporates or is coupled to memory circuitry. The processor 102 can include or be implemented as a multi-core processor, a digital signal processor (DSP), an audio processor or a combination of these processors. For example, the processor 102 may be implemented in a variety of different ways, such as with a mixture of discrete analog and digital components that include a processor configured to execute programmed instructions contained in a processor-readable storage medium (e.g., solid-state memory, e.g., Flash).

The processor 102 is coupled to a wireless transceiver 104 (also referred to herein as a radio), such as a BLE transceiver. The wireless transceiver 104 is operably coupled to an antenna 106 configured for transmitting and receiving radio signals. The antenna 106, according to various embodiments, includes a substrate 107 comprising a dielectric gel and/or a dielectric liquid. In some embodiments, the antenna 106 incorporates a dielectric gel and/or a dielectric liquid as a standalone layer of the substrate 107. In other embodiments, the antenna 106 incorporates a dielectric gel and/or a dielectric liquid within a solid portion or portions of the substrate 107 (e.g., solid and gel/liquid layers or channels). The dielectric material of the dielectric gel or dielectric liquid preferably has low dielectric loss. In some embodiments, the dielectric material of the dielectric gel and/or dielectric liquid is formulated to approximate the dielectric constant of human tissue (e.g., tissue of the head).

The wireless transceiver 104 and antenna 106 can be configured to enable ear-to-ear communication between the two hearing devices 100A and 100B, as well as communications with an external device (e.g., a smartphone or a digital music player). A battery 110 or other power source (rechargeable or conventional) is provided within the enclosure 101 and is configured to provide power to the various components of the hearing devices 100A and 100B. A speaker or receiver 108 is coupled to an amplifier (not shown) and the processor 102. The speaker or receiver 108 is configured to generate sound which is communicated to the wearer's ear.

In some embodiments, the hearing devices 100A and 100B include a microphone 112 mounted on or inside the enclosure 101. The microphone 112 may be a single microphone or multiple microphones, such as a microphone array. The microphone 112 can be coupled to a preamplifier (not shown), the output of which is coupled to the processor 102. The microphone 112 receives sound waves from the environment and converts the sound into an input signal. The input signal is amplified by the preamplifier and sampled and digitized by an analog-to-digital converter of the processor 102, resulting in a digitized input signal. In some embodiments (e.g., hearing aids), the processor 102 (e.g., DSP circuitry) is configured to process the digitized input signal into an output signal in a manner that compensates for the wearer's hearing loss. When receiving an audio signal from an external source, the wireless transceiver 104 may produce a second input signal for the DSP circuitry of the processor 102 that may be combined with the input signal produced by the microphone 112 or used in place thereof. In other embodiments, (e.g., hearables), the processor 102 can be configured to process the digitized input signal into an output signal in a manner that is tailored or optimized for the wearer (e.g., based on wearer preferences). The output signal is then passed to an audio output stage that drives the speaker or receiver 108, which converts the output signal into an audio output.

Some embodiments are directed to a custom hearing aid, such as an ITC, CIC, or IIC hearing aid. For example, some embodiments are directed to a custom hearing aid which includes a wireless transceiver and an antenna arrangement configured to operate in the 2.4 GHz ISM frequency band or other applicable communication band (referred to as the "Bluetooth® band" herein). As was discussed previously, creating a robust antenna arrangement for a 2.4 GHz custom hearing aid represents a significant engineering challenge. A custom hearing aid is severely limited in space, and the antenna arrangement is in close proximity to other electrical components, both of which impacts antenna performance. Because the human body is very lossy and a custom hearing aid is positioned within the ear canal, a high performance antenna 106 (e.g., high antenna radiation efficiency and/or wide bandwidth) is particularly desirable. Embodiments of the disclosure are directed to a high performance antenna 106 which incorporates a substrate comprising one or both of a dielectric gel and a dielectric liquid.

Figure 2A:
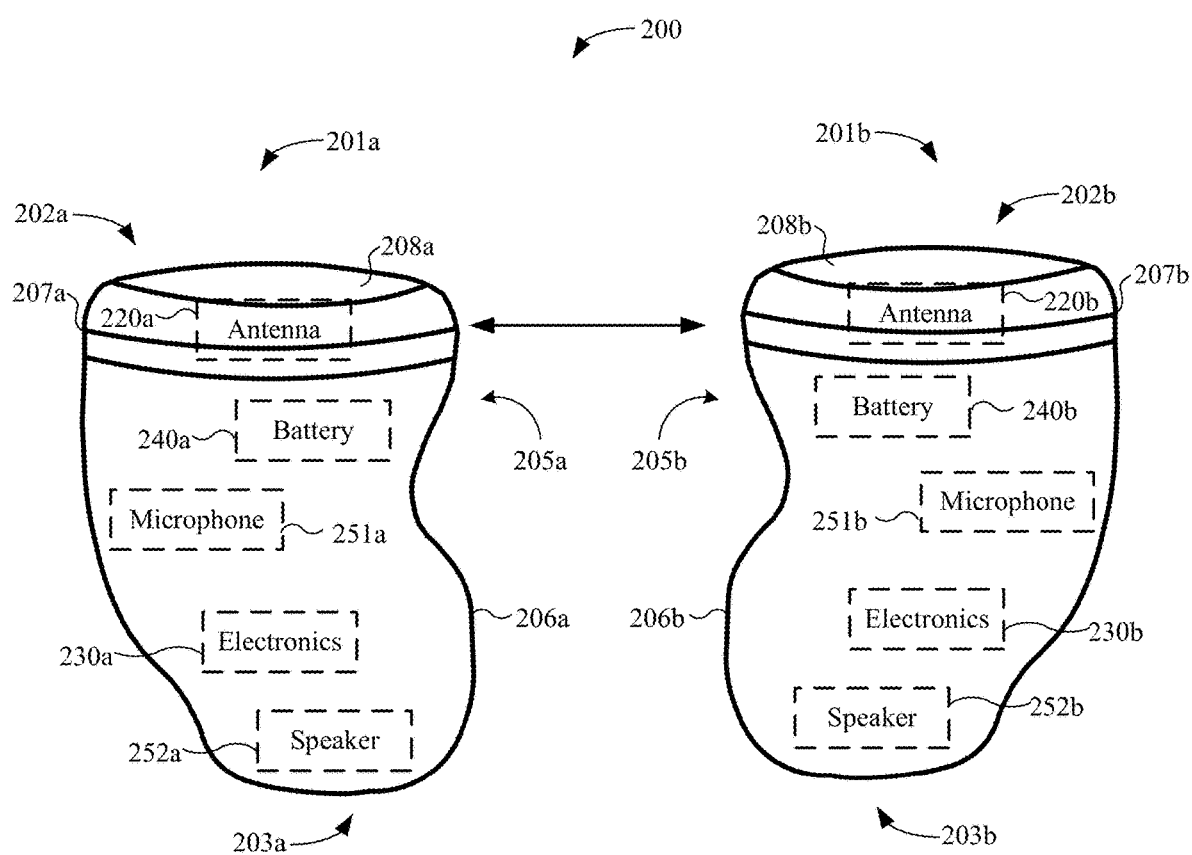
FIGS. 2A and 2B illustrate a custom hearing device system which incorporates an antenna which includes a substrate comprising a dielectric gel and/or dielectric fluid in accordance with various embodiments.
Figure 2B:
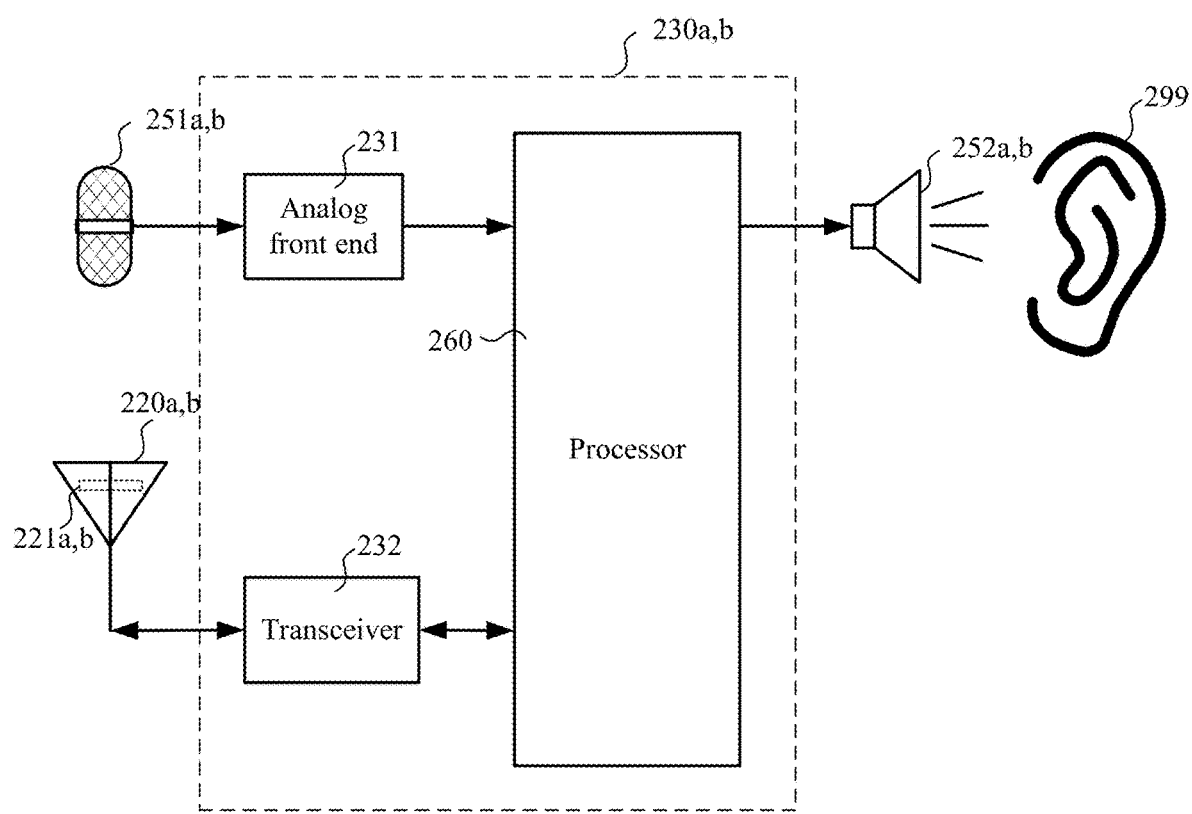

FIGS. 2A and 2B illustrate a custom hearing aid system which incorporates a high performance antenna in accordance with various embodiments. The hearing aid system 200 shown in FIGS. 2A and 2B includes two hearing devices, e.g., left 201a and right 201b side hearing devices, configured to wirelessly communicate with each other and external devices and systems. FIG. 2A conceptually illustrates functional blocks of the hearing devices 201a, 201b. The position of the functional blocks in FIG. 2A does not necessarily indicate actual locations of components that implement these functional blocks within the hearing devices 201a, 201b. FIG. 2B is a block diagram of components that may be disposed at least partially within the enclosure 205a, 205b of the hearing device 201a, 20 b.

Each hearing device 201a, 201b includes a physical enclosure 205a, 205b that encloses an internal volume. The enclosure 205a, 205b is configured for at least partial insertion within the wearer's ear canal. The enclosure 205a, 205b includes an external side 202a, 202b that faces away from the wearer and an internal side 203a, 203b that is inserted in the ear canal. The enclosure 205a, 205b comprises a shell 206a, 206b and a faceplate 207a, 207b. The shell 206a, 206b typically has a shape that is customized to the shape of a particular wearer's ear canal. The faceplate 207a, 207b may include a battery door 208a, 208b or drawer disposed near the external side 202a, 202b of the enclosure 205a, 205b and configured to allow the battery 240a, 240b to be inserted and removed from the enclosure 205a, 205b. The hearing device 201a, 201b may include a rechargeable battery (e.g., a lithium-ion battery) and charging circuitry (not shown) configured to cooperate with a charging unit to implement a charging procedure to charge the rechargeable battery.

An antenna 220a, 220b includes a substrate 221a, 221b comprising a dielectric gel and/or a dielectric liquid, various configurations of which are illustrated and described herein. The dielectric gel/liquid-filled substrate 221a, b of the antenna 220a, 220b, which can include or be coupled to a matching circuit, allows the antenna 220a, 220b to fit within a customized device, while providing a specified antenna efficiency, e.g., an optimal antenna efficiency for the customized environment and/or particular wearer. The antenna 220a, 220b can be mounted on the faceplate 207a, 207b.

The battery 240a, 240b powers electronic circuitry 230a, 230b which is also disposed within the shell 206a, 206b. As illustrated in FIGS. 2A and 2B, the hearing device 201a, 201b may include one or more microphones 251a, 251b configured to pick up acoustic signals and to transduce the acoustic signals into microphone electrical signals. The electrical signals generated by the microphones 251a, 251b may be conditioned by an analog front end 231 (see FIG. 2B) by filtering, amplifying and/or converting the microphone electrical signals from analog to digital signals so that the digital signals can be further processed and/or analyzed by the processor 260. The processor 260 may perform signal processing and/or control various tasks of the hearing device 201a, 201b. In some implementations, the processor 260 comprises a DSP that may include additional computational processing units operating in a multi-core architecture.

The processor 260 is configured to control wireless communication between the hearing devices 201a, 201b and/or an external accessory device (e.g., a smartphone, a digital music player) via the antenna 220a, 220b. The wireless communication may include, for example, audio streaming data and/or control signals. The electronic circuitry 230a, 230b of the hearing device 201a, 201b includes a transceiver 232. The transceiver 232 has a receiver portion that receives communication signals from the antenna 220a, 220b, demodulates the communication signals, and transfers the signals to the processor 260 for further processing. The transceiver 232 also includes a transmitter portion that modulates output signals from the processor 260 for transmission via the antenna 220a, 220b. Electrical signals from the microphone 251a, 251b and/or wireless communication received via the antenna 220a, 220b may be processed by the processor 260 and converted to acoustic signals played to the wearer's ear 299 via a speaker 252a, 252b.

Figure 3A:
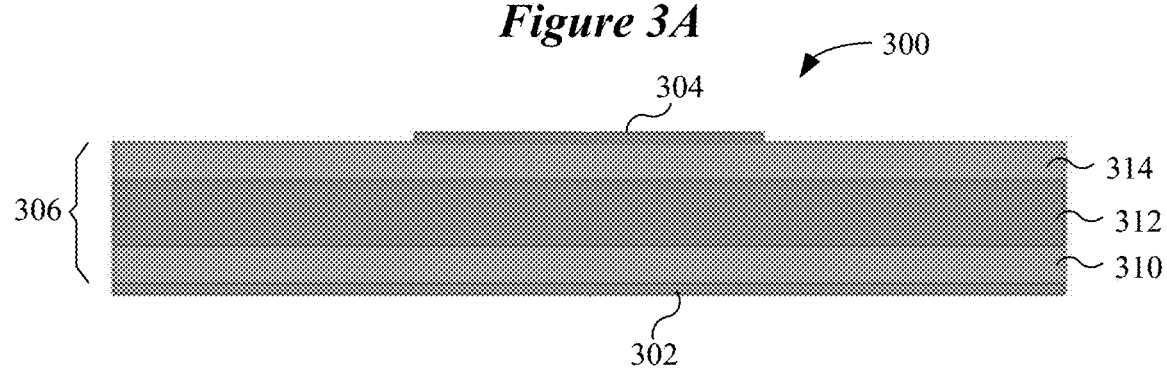
FIGS. 3A-3C illustrate an antenna which includes a substrate comprising a dielectric gel and/or a dielectric liquid in accordance with various embodiments.
Figure 3B:
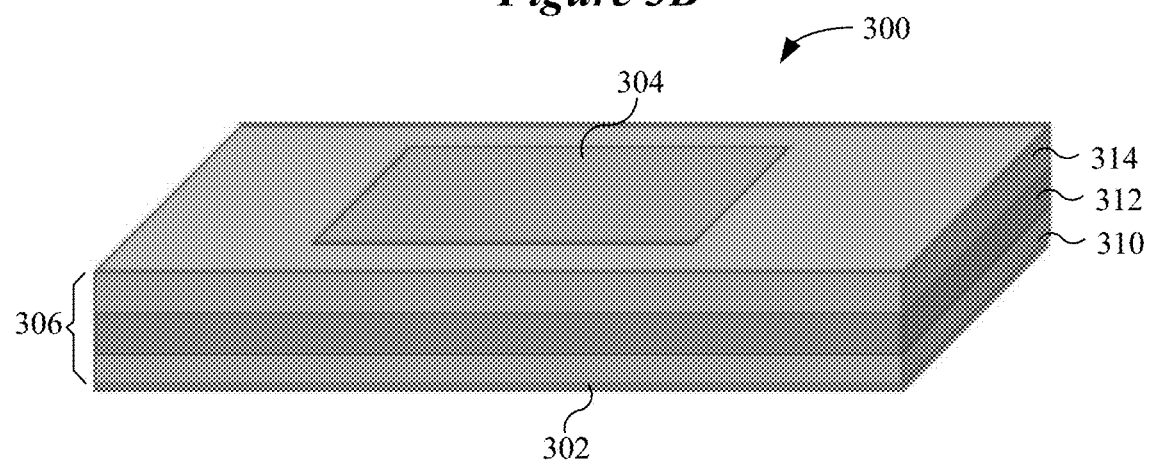
Figure 3C:
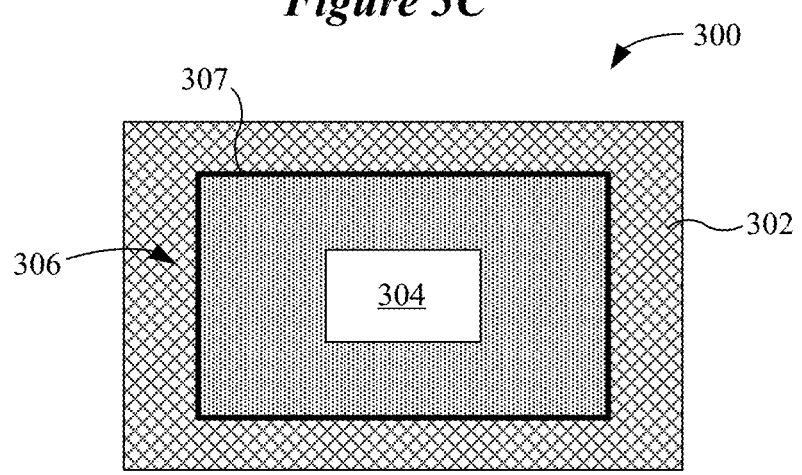

FIGS. 3A-3C illustrate an antenna which includes a substrate comprising a dielectric gel and/or a dielectric liquid in accordance with various embodiments. The antenna 300 includes a ground plane 302 comprising an electrically conductive material (e.g., copper). The antenna 300 also includes a radiating element (e.g., a patch) 304 comprising an electrically conductive material (e.g., copper) which is spaced apart from the ground plane 302. A substrate 306 is disposed between the ground plane 302 and the radiating element 304. According to various embodiments, the substrate 306 comprises a dielectric gel and/or a dielectric liquid.

The substrate 306 is a multi-layer structure comprising one or more solid layers and one or more gel and/or liquid layers. In the embodiment shown in FIGS. 3A-3C, the substrate 306 includes a first solid substrate 310 in contact with or proximate to the ground plane 302. The substrate 306 also includes a second solid substrate 314 in contact with or proximate to the radiating element 304. The substrate 306 further includes a dielectric gel and/or liquid 312 disposed between the first and second solid substrate 310, 314. In some embodiments, the dielectric constant of the substrate 306 is dominated by the dielectric constant of the dielectric gel/liquid layer or layers 312. In other embodiments, the dielectric constant of the substrate 306 is as a composite value reflective of the dielectric constant of the dielectric gel/liquid layer(s) 312 and the dielectric constant of the first and second solid substrates 310, 314.

As is shown in FIG. 3C, the dielectric gel/liquid of the substrate 306 can be contained within an enclosure 307. In some embodiments, the enclosure 307 defines a solid peripheral edge of the dielectric gel/liquid layer 312, with the first and second solid substrate 310, 314 serving as top and bottom surfaces of the enclosure 307. In other embodiments, the enclosure 307 defines a unitary structure comprising the solid peripheral edge with top and bottom surfaces (separate from the first and second solid substrates 310, 314) that together contain the dielectric gel/liquid material.

In general, the dielectric constant (Er) of the substrate 306 can vary from about 1 to about 200. A specified dielectric constant value for the substrate 306 can be achieved by considering the dielectric constant of the dielectric gel/liquid material 312 and, if applicable, the dielectric constant of the first and second solid substrates 310, 314.

Incorporating a dielectric gel/liquid into the structure of the substrate 306 advantageously provides enhanced flexibility for achieving a desired dielectric constant for the substrate 306 which is not feasible when using a conventional solid substrate (having a fixed dielectric constant) alone. For example, the concentration and/or formulation of dielectric material within the dielectric gel and/or liquid layer 312 can be adjusted to increase or decrease the dielectric constant of the substrate 306 as desired. The dielectric gel/liquid-filled substrate 306 can have any shape to meet specified antenna size and performance requirements. Dielectric gel/fluid-filled structures of the substrate 306 can be positioned in different planes, angles, and directions for purposes of enhancing or optimizing antenna performance. Inclusion of the dielectric gel and/or liquid layer 312 in the substrate 306 allows for tuning the antenna 300 in a manner that can be optimized for a particular wearer of an ear-worn electronic device that incorporates the antenna 300.

In general, the dielectric constant of the dielectric gel/liquid material 312 can vary from about 5 to about 200, such as from about 10 to about 100. In the specific case of relatively small ear-worn electronic devices, the dielectric constant of the dielectric gel/liquid material 312 can vary from about 50 to about 150 (e.g., from ~75 to ~125, from ~80 to ~110, from ~90 to ~100, from ~93 to ~97, at least ~60, at least ~80, at least ~95). Dielectric gels and/or liquids with a relatively high dielectric constant (e.g., ~50-~200) can provide for a significant reduction in the physical size of the antenna 300 while maintaining specified antenna performance.

Various dielectric materials can be used in the dielectric gel/liquid layer 312. In some embodiments, the dielectric gel/liquid layer 312 comprises a liquid comprising one or more dielectric additives or components. For example, the dielectric gel/liquid layer 312 can include a liquid comprising a solvent(s) and a solute(s), one or both of which contributes to the dielectric constant of the dielectric liquid layer 312. In other embodiments, the dielectric gel/liquid layer 312 can comprise a gel containing dielectric material (e.g., single or multiple materials). A gel is generally understood to be a combination of a solid and a liquid. Gels can be described as a dispersion of molecules of a liquid within a solid, in which the liquid particles are dispersed in the solid medium. For example, a gel can be considered a class of colloids formed when colloidal particles are liquid and the dispersion phase are solid. A gel can be defined as a substantially dilute cross-linked system, which exhibits no flow when in the steady-state.

According to various embodiments, one or both of the solid and liquid components of a dielectric gel can comprise material that contributes to the dielectric constant of the dielectric gel layer 312. In some embodiments, the dielectric gel/liquid layer 312 includes a dielectric solid or solute that remains in the dielectric gel/liquid layer 312 after evaporation of a liquid component of the dielectric gel/liquid layer 312.

A dielectric gel and/or a dielectric liquid, which is incorporated in layer 312, can include one or a combination of dielectric materials or components. By way of example, and not of limitation, the dielectric gel/liquid layer 312 can comprise water ($\varepsilon_r \approx 80$), graphite ($\varepsilon_r \approx 10\text{-}15$), ground glass ($\varepsilon_r \approx 5\text{-}10$), graphite ($\varepsilon_r \approx 10\text{-}15$), titanium dioxide ($\varepsilon_r \approx 86\text{-}173$), barium titanate ($\varepsilon_r \approx 100\text{-}1,250$), barium strontium titanate ($\varepsilon_r \approx 500$), or a combination of any of these materials. Any of these or other dielectric materials can be used, individually or in combination, to achieve a desired dielectric constant for the dielectric gel/liquid layer 312.

The dielectric constant of the first and second solid substrates 310, 314 can vary from about 1 to about 20 (e.g., from ~2 to ~13, from ~8 to ~15). Suitable materials for the first and second solid substrate 310, 314 include, but are not limited to, the following:

| Substrate Materials | $\varepsilon_r$ |
|---|---|
| Duroid-5880 | 2.2 |
| Duroid-6010 | 10.7 |
| RO 3003 | 3.00 |
| RO 3010 | 10.2 |
| RO 3435 | 3.48 |
| RO 4350 | 3.48 |
| Foam | 1.05 |
| FR4 | 4.7 |
| HK 04J | 3.5 |
| IS 410 | 5.4 |
| DiClad 870 | 2.33 |
| Polyguide | 2.32 |
| NH 9320 | 3.2 |
| RF-60A | 6.15 |
| Nylon fabric | 3.6 |

According to various embodiments, an antenna of the present disclosure is designed to resonate at a specified operating frequency or band of frequencies in response to the dielectric gel/fluid-filled substrate having a predetermined dielectric constant. For example, an antenna incorporating a dielectric gel/fluid-filled substrate can be configured to operate in the 2.4 GHz ISM frequency band or other applicable communication band. To operate properly within this frequency band, the dielectric gel and/or dielectric liquid has a dielectric constant that allows the substrate to achieve the predetermined dielectric constant or dielectric constant range (e.g., $\varepsilon_r \approx 96$ for the antenna simulation of FIG. 9). Incorporating a gel and/or a liquid having a relatively high dielectric constant (e.g., at least ~80, from ~80 to ~110) into the antenna substrate provides for an antenna of reduced size (e.g., for custom hearing devices) while providing higher radiation efficiency and/or wider bandwidth when compared to antennas incorporating conventional solid substrates.

Figure 4:
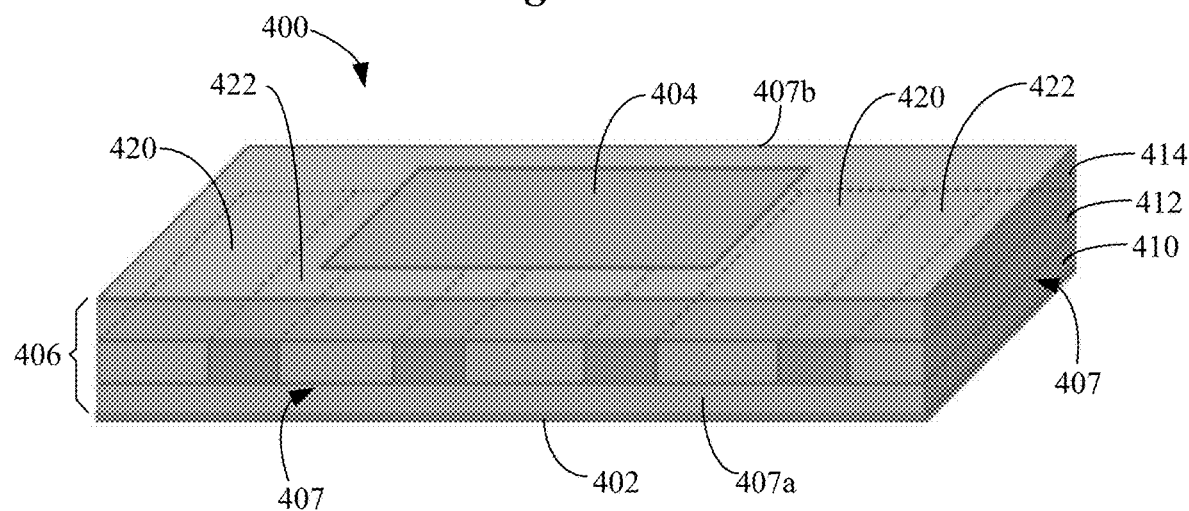
FIG. 4 illustrates an antenna which includes a substrate comprising a dielectric gel and/or a dielectric liquid in accordance with various embodiments.

FIG. 4 illustrates an antenna which includes a substrate comprising a dielectric gel and/or a dielectric liquid in accordance with various embodiments. The antenna 400 shown in FIG. 4 includes a ground plane 402 comprising an electrically conductive material. The antenna 400 also includes a radiating element (e.g., a patch) 404 comprising an electrically conductive material which is spaced apart from the ground plane 402. A substrate 406 is disposed between the ground plane 402 and the radiating element 404. The substrate 406 is a multi-layer structure comprising one or more solid layers and one or more gel and/or liquid layers.

In the embodiment shown in FIG. 4, the substrate 406 includes a first solid substrate 410 in contact with or proximate to the ground plane 402. The substrate 406 also includes a second solid substrate 414 in contact with or proximate to the radiating element 404. The substrate 406 further includes a layer 412 comprising a combination of solid and gel/liquid sections disposed between the first and second solid substrate 410, 414. More particularly, the substrate 406 includes a plurality of channels 422 disposed between solid sections 420 of the substrate 406.

In the embodiment shown in FIG. 4, the channels 422 extend between, and terminate at, opposing edge surfaces 407 of the substrate 406. For example, each of the channels 422 has a first end originating at a first edge surface 407a and a second end terminating at a second edge surface 407b of the substrate 406. In some embodiments, one or more of the channels 422 can have a single open-end configuration, such that a first end originates at one of the edge surfaces 407a, 407b and a second end terminates prior to the opposing edge surface 407b, 407a. Although the channels 422 are shown as having a rectangular cross-section, it is understood that other cross-sections are contemplated (e.g., square, round, oval cross-sections).

Each of the channels 422 is filled with a dielectric gel or a dielectric liquid (e.g., see example materials discussed above). According to various embodiments, some of the channels 422 can be filled with a dielectric gel while other channels 422 can be filled with a dielectric liquid. In other embodiments, the dielectric gel/liquid contained within the channels 422 can have the same composition (e.g., the same dielectric constant). In other embodiments, the channels 422 can contain dielectric gels/liquids having different compositions (e.g., different dielectric constants). In some embodiments, the dielectric constant of the substrate 406 is dominated by the dielectric constant of the combined dielectric gel/liquid and solid substrate layer 412. In other embodiments, the dielectric constant of the substrate 406 is as a composite value reflective of the dielectric constant of the combined dielectric gel/liquid and solid substrate layer 412 and the dielectric constant of the first and second solid substrates 410, 414. As was previously discussed, the concentration and/or formulation of dielectric material within the dielectric gel and/or liquid layer 412 can be adjusted to increase or decrease the dielectric constant of the substrate 406 as desired.

Figure 5:
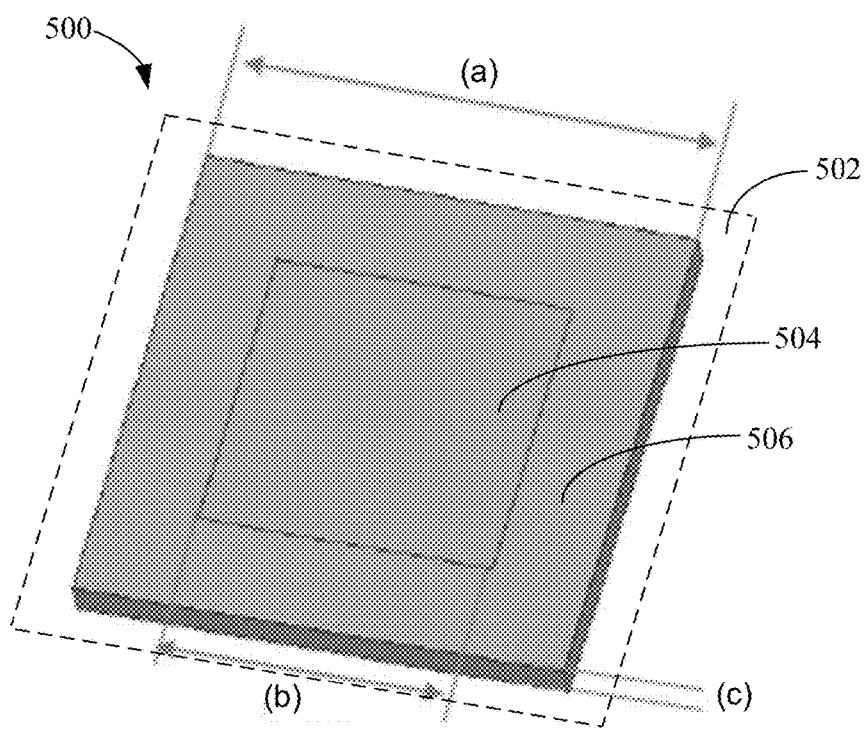
FIG. 5 illustrates an antenna which includes a substrate comprising a dielectric gel and/or a dielectric liquid in accordance with various embodiments.

FIG. 5 illustrates an antenna which includes a substrate comprising a dielectric gel and/or a dielectric liquid in accordance with various embodiments. The antenna 500 includes a radiating element (e.g., a patch) 504 comprising electrically conductive material which is spaced apart from a ground plane 502 by a substrate 506. The substrate 506 comprises a dielectric gel and/or a dielectric liquid of a type previously described. In the embodiment shown in FIG. 5, the radiating element 504 and the substrate 506 have a square shape. It is understood that, in other embodiments, the radiating element 504 can have a variety of shapes, including a rectangular, circular, elliptical, hexagonal, or fractal shape.

According to various embodiments, the square substrate 506 has sides having a length (a) of about 6 mm to about 12 mm (e.g., ~10 mm). The square radiating element 504 has sides having a length (b) of about 4 mm to about 8 mm (e.g., ~6 mm). The substrate 506 has a thickness (c) of about 0.6 mm to about 1.0 mm (e.g., ~0.8 mm). The antenna 500 shown in FIG. 5 is well suited for incorporation in a custom ear-worn electronic device designed to be partially or entirely inserted into a wearer's ear canal (e.g., an ITE, ITC IIC or CIS device).

Figure 6:
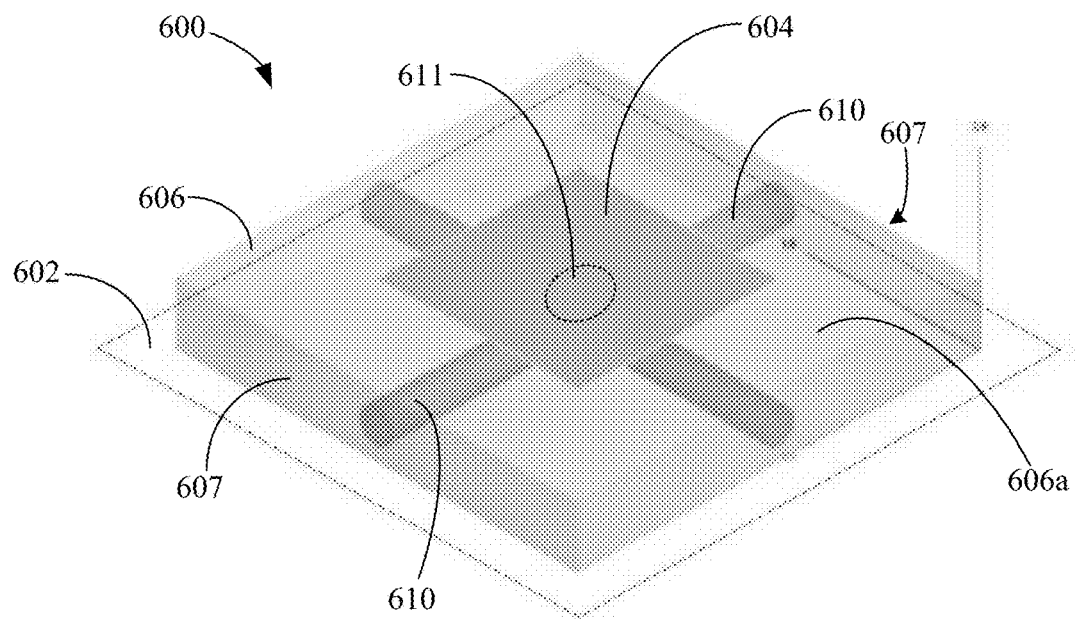
FIG. 6 illustrates an antenna which incorporates a substrate comprising a dielectric gel and/or dielectric liquid in accordance with various embodiments.

FIG. 6 illustrates an antenna which incorporates a substrate comprising a dielectric gel and/or dielectric liquid in accordance with various embodiments. The antenna 600 includes a radiating element (e.g., a patch) 604 comprising electrically conductive material which is spaced apart from a ground plane 602 by a substrate 606 comprising a dielectric gel and/or a dielectric liquid of a type previously described. The substrate 606 includes a solid section 606a and a plurality of channels 610 disposed within the solid section 606a. Each of the channels 610 includes a first end originating at one of the edge surfaces 607 of the substrate 606.

According to some embodiments, each of the channels 610 includes a second end which terminates at an opposing edge surface 607 of the substrate 606. Each of the channels 610 is independent of other channels 610, such that none of the channels 610 are fluidically coupled. In this configuration, the substrate 606 incorporates two fluidically independent channels 610. The channels 610 are positioned within the substrate 606 such that all or at least a portion (e.g., portion under the radiating element 604) of the channels 610 is located on different horizontal planes within the substrate 606.

In accordance with other embodiments, the channels 610 are fluidically coupled at a fluidic junction 611 positioned away from the edge surfaces 607. In such embodiments, the second end of each channel 610 terminates at the fluidic junction 611, which can be located below the radiating element 604. In this configuration, the substrate 606 incorporates four fluidically coupled channels 610. The fluidically coupled channels 610 can be located on the same horizontal plane (or on different planes) within the substrate 606.

Figure 7:
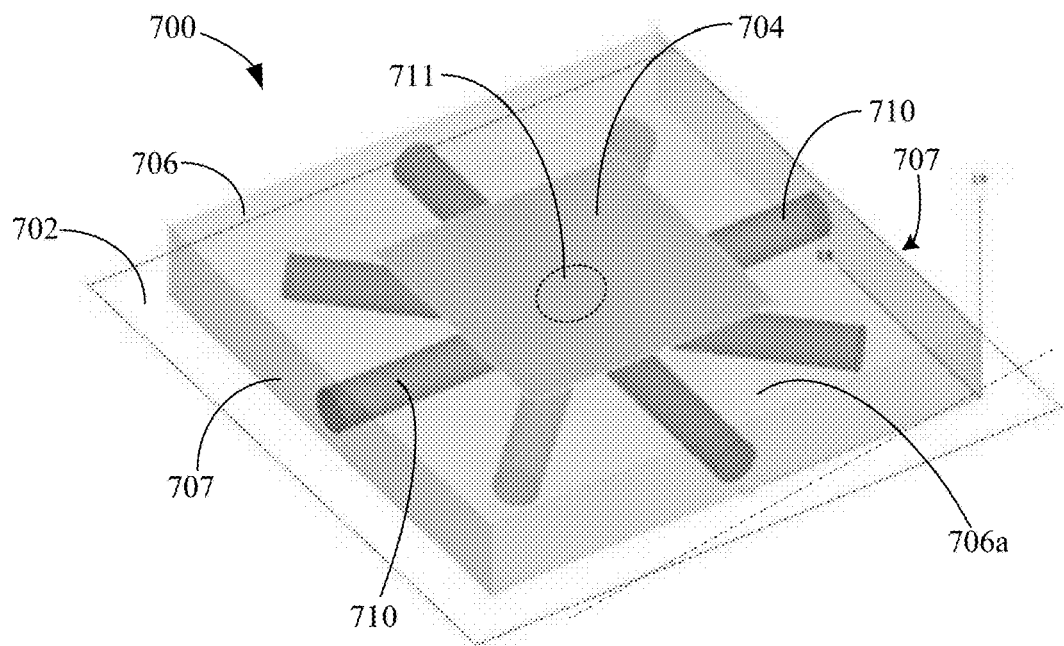
FIG. 7 illustrates an antenna which incorporates a substrate comprising a dielectric gel and/or dielectric liquid in accordance with various embodiments.

FIG. 7 illustrates an antenna which incorporates a substrate comprising a dielectric gel and/or dielectric liquid in accordance with various embodiments. The antenna 700 includes a radiating element (e.g., a patch) 704 comprising electrically conductive material which is spaced apart from a ground plane 702 by a substrate 706 comprising a dielectric gel and/or a dielectric liquid of a type previously described. The substrate 706 includes a solid section 706a and a plurality of channels 710 disposed within the solid section 706a. Each of the channels 710 includes a first end originating at one of the edge surfaces 707 of the substrate 706.

According to some embodiments, each of the channels 710 includes a second end which terminates at an opposing edge surface 707 of the substrate 706. Each of the channels 710 is independent of other channels 710, such that none of the channels 710 are fluidically coupled. In this configuration, the substrate 706 incorporates four fluidically independent channels 710. The channels 710 are positioned within the substrate 706 such that all or at least a portion (e.g., portion under the radiating element 704) of the channels 710 is located on different horizontal planes within the substrate 706.

In accordance with other embodiments, the channels 710 are fluidically coupled at a fluidic junction 711 positioned away from the edge surfaces 707. In such embodiments, the second end of each channel 710 terminates at the fluidic junction 711, which can be located below the radiating element 704. In this configuration, the substrate 706 incorporates eight fluidically coupled channels 710. The fluidically coupled channels 710 can be located on the same horizontal plane (or on different planes) within the substrate 706.

The antennas shown in the figures are generally representative of a patch-type antenna. Patch antennas, also referred to as rectangular microstrip antennas, are low profile and lightweight making them well-suited for use in ear-worn electronic devices, such as hearing aids and other hearables. Various types of patch antennas can be implemented to incorporate a substrate comprising a dielectric gel and/or dielectric liquid, including a Planar Inverted-F Antenna (referred to as a PIFA antenna) and an Inverted-F Antenna (referred to as an IFA antenna).

Figure 8A:
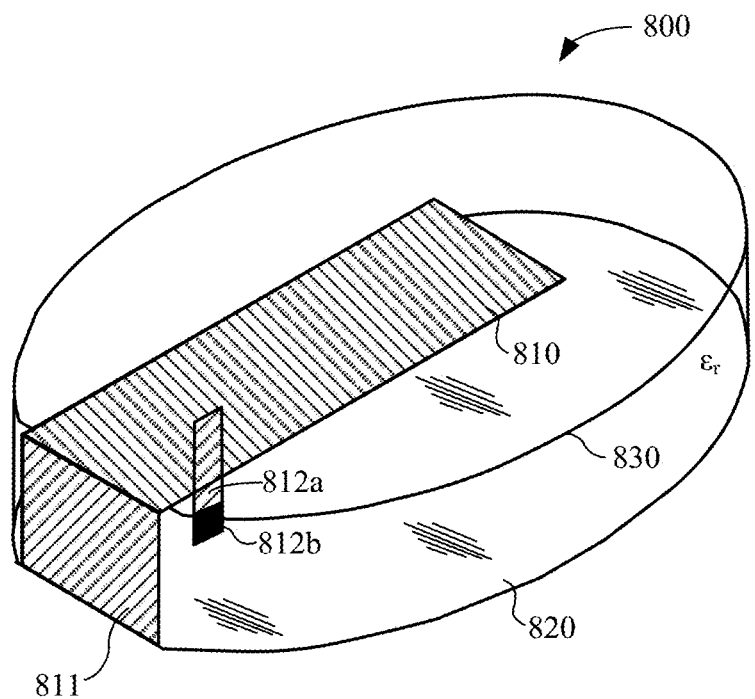
FIGS. 8A and 8B show perspective and cross-sectional views, respectively, of an antenna which incorporates a substrate comprising a dielectric gel and/or a dielectric liquid in accordance with various embodiments.
Figure 8B:
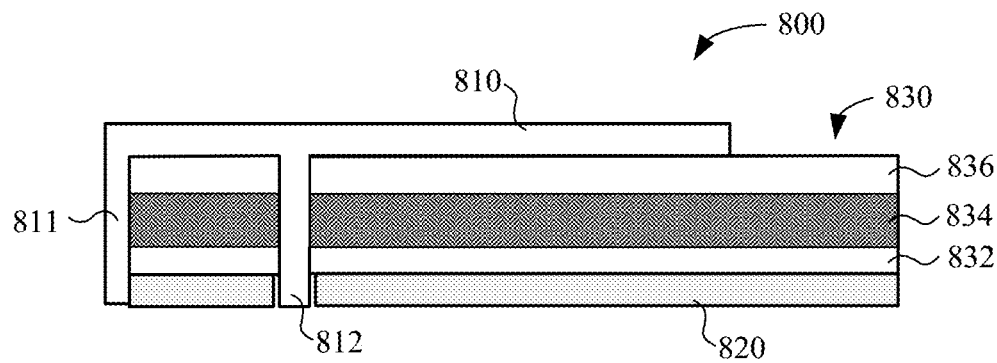

FIGS. 8A and 8B show perspective and cross sectional views, respectively, of a PIFA antenna which incorporates a substrate comprising a dielectric gel and/or dielectric liquid in accordance with various embodiments. The PIFA antenna 800 shown in FIGS. 8A and 8B includes a conductive patch 810 and a ground plane 820 that overlaps and is spaced apart from the patch 810. The ground plane 820 is separated from the conductive patch 810 by a substrate 830 comprising a dielectric gel and/or a dielectric liquid. A shorting wall or pin 811 shorts the patch 810 to the ground plane 820. To achieve a desired antenna response, the PIFA antenna 800 may include multiple shorting pins. A wireless transceiver of an ear-worn electronic device can be coupled to the PIFA antenna 800 through a feed arrangement comprising a feed arm 812a and a feed point 812b.

The substrate 830 is a multi-layer structure comprising one or more solid layers and one or more gel and/or liquid layers. As shown in FIG. 8B, the substrate 830 includes a first solid substrate 832 in contact with or proximate to the ground plane 820. The substrate 830 also includes a second solid substrate 836 in contact with or proximate to the patch 810. The substrate 830 further includes a dielectric gel and/or liquid 834 disposed between the first and second solid substrates 832, 836. In some embodiments, the dielectric constant of the substrate 830 is dominated by the dielectric constant of the dielectric gel/liquid layer or layers 834. In other embodiments, the dielectric constant of the substrate 830 is as a composite value reflective of the dielectric constant of the dielectric gel/liquid layer(s) 834 and the dielectric constant of the first and second solid substrates 832, 836.

FIGS. 3-8 show a variety of antennas comprising a dielectric gel/fluid-filled substrate. It is understood that the dielectric gel and/or fluid can be contained within the antenna substrate in various ways and configurations. The gel/fluid-filled substrate can take any form and combinations to meet specified antenna performance requirements. For example, the dielectric gel/fluid can be arranged as strip lines, channels, wells, pockets or voids within the antenna substrate. These dielectric gel/fluid-filled structures can be positioned in different planes, angles, and directions whenever possible for purposes of enhancing or optimizing antenna performance.

Figure 9:
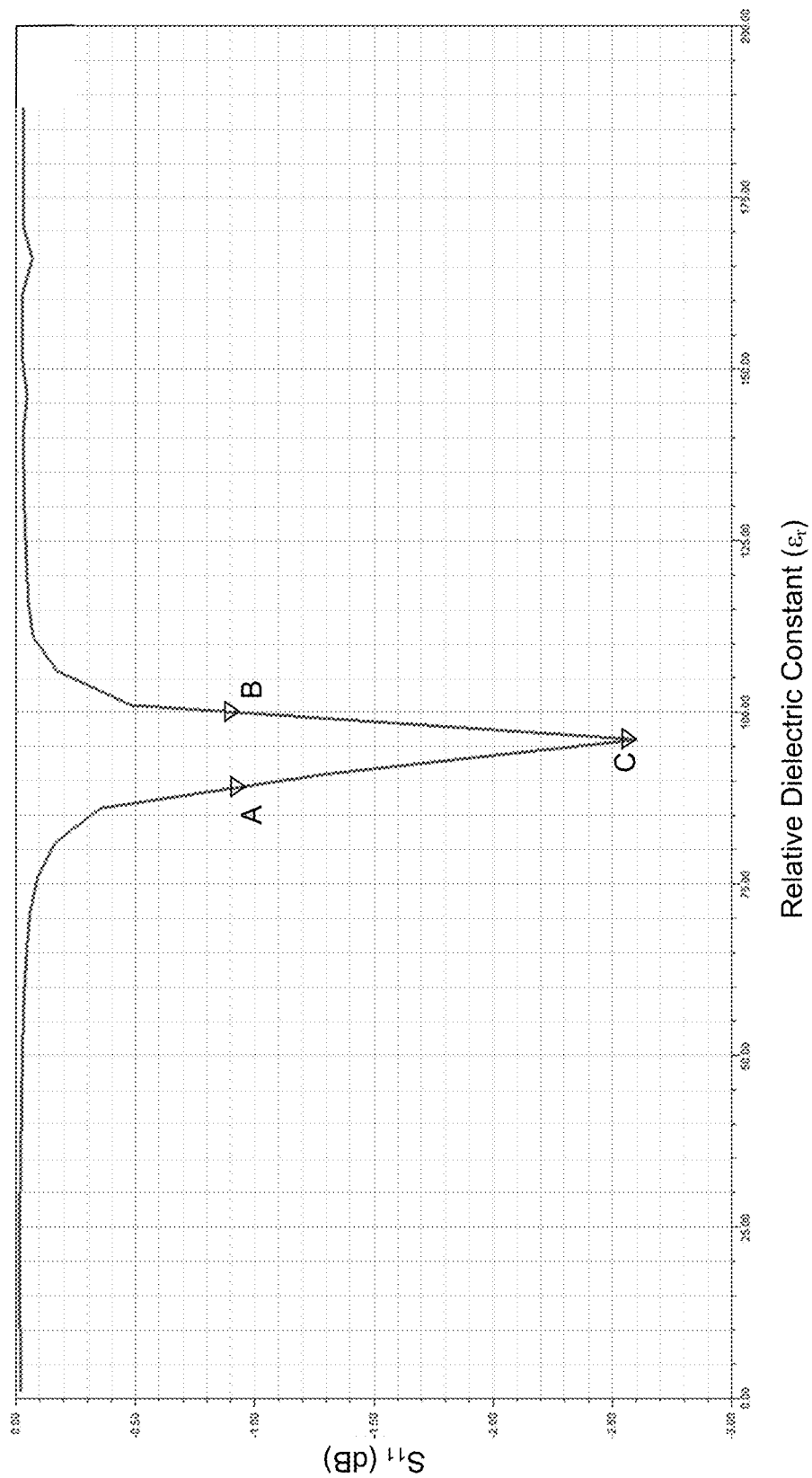
FIG. 9 is a graph showing the reflection coefficient as a function of relative dielectric constant for a simulated antenna, the antenna simulated to include a substrate comprising a dielectric gel and/or a dielectric liquid in accordance with various embodiments.

Modeling was performed to simulate an antenna comprising a substrate filled with a dielectric gel and/or a dielectric fluid in accordance with various embodiments. The antenna configuration shown generally in FIG. 5 was evaluated. The dimensions (a), (b), and (c), were given as 10 mm, 6 mm, and 0.8 mm, respectively. FIG. 9 is a graph showing the reflection coefficient ($S_{11}$) of the simulated antenna as a function of dielectric constant ($\varepsilon_r$) when fed with a 2.44 GHz signal. As can be seen in FIG. 9, the simulated antenna resonates when the dielectric constant, $\varepsilon_r$, is ~96. Considering $\varepsilon_r$=96 as a center point (c) with $S_{11}$=−2.6 dB, a lower $\varepsilon_r$ limit (a) and an upper $\varepsilon_r$ limit (b) can be set such that their $S_{11}$ value is about −1 dB as worst case. As such, a dielectric constant, $\varepsilon_r$, in the range of about 89 to about 100 can be considered an operational range for the simulated antenna.

The modeling exercise demonstrated that an antenna comprising a substrate filled with a dielectric gel and/or a dielectric fluid can be tuned by changing the dielectric constant of the gel and/or fluid contained within the substrate. The modeling exercise also demonstrated that the antenna can be further miniaturized and then re-tuned by changing the dielectric constant of the gel or fluid contained within the substrate.

The specific configuration of an antenna of an ear-worn electronic device is generally dependent on a number of factors, including the space available in a particular ear-worn electronic device and the particular antenna performance requirements. Due to the performance benefit and small size, an antenna comprising a dielectric gel/liquid-filled substrate may be incorporated in devices beyond ear-worn electronic devices where device size significantly limits antenna size. Other devices that can incorporate an antenna of the present disclosure include, but are not limited to, fitness and/or health monitoring watches or other wrist worn or hand-held objects, e.g., Apple Watch®, Fitbit®, cell phones, smartphones, handheld radios, medical implants, hearing aid accessories, wireless capable helmets (e.g., used in professional football), and wireless headsets/headphones (e.g., virtual reality headsets). Each of these devices is represented by the system block diagram of FIG. 1A or 1B, with the components of FIGS. 1A and 1B varying depending on the particular device implementation.

This document discloses numerous embodiments, including but not limited to the following:

Item 1 is an ear-worn electronic device configured to be worn by a wearer, comprising:
 a housing configured to be supported at, by, in or on the wearer's ear;
 a processor disposed in the housing;
 a speaker or a receiver operably coupled to the processor;
 a radio frequency transceiver disposed in the housing and operably coupled to the processor; and
 an antenna disposed on or in the housing and operably coupled to the transceiver, the antenna comprising:
  a radiating element;
  a ground plane; and
  a substrate disposed between the radiating element and the ground plane, the substrate comprising a dielectric gel or a dielectric liquid.

Item 2 is the device of item 1, wherein the substrate comprises:
 a first solid substrate;
 a second solid substrate; and
 an interposing substrate disposed between the first and second solid substrates, the interposing substrate containing the dielectric gel or the dielectric liquid.

Item 3 is the device of item 1, wherein the substrate comprises a plurality of channels each containing the dielectric gel or the dielectric liquid.

Item 4 is the device of item 3, wherein the plurality of channels are fluidically isolated from one another.

Item 5 is the device of item 3, wherein the plurality of channels are fluidically coupled to one another.

Item 6 is the device of item 1, wherein the substrate comprises:
 a plurality of edge surfaces and a plurality of channels;
 each of the channels having a first end originating at one of the edge surfaces; and
 each of the channels having a second end terminating at a fluidic junction positioned away from the edge surfaces.

Item 7 is the device of item 1, wherein:
 the substrate comprises a plurality of channels;
 at least a first channel of the plurality of channels contains a first dielectric gel or a first dielectric liquid having a first dielectric constant; and
 at least a second channel of the plurality of channels contains a second dielectric gel or a second dielectric liquid having a second dielectric constant differing from the first dielectric constant.

Item 8 is the device of item 1, wherein:
 the antenna is designed to resonate at a specified operating frequency or band of frequencies in response to the substrate having a predetermined dielectric constant; and
 the dielectric gel or the dielectric liquid has a dielectric constant that allows the substrate to achieve the predetermined dielectric constant.

Item 9 is the device of item 1, wherein the dielectric gel or the dielectric liquid has a dielectric constant in the range from about 5 to about 200.

Item 10 is the device of item 1, wherein the dielectric gel or the dielectric liquid has a dielectric constant of at least 80.

Item 11 is the device of item 1, wherein the dielectric gel or the dielectric liquid comprises water, graphite, ground glass, graphite, titanium dioxide, barium titanate, of barium strontium titanate, or a combination of any of these materials.

Item 12 is the device of item 1, wherein the transceiver and the antenna are configured to operate within a 2.4 GHz ISM frequency band or other applicable communication band.

Item 13 is the device of item 1, wherein the antenna is configured as a patch-type antenna.

Item 14 is the device of item 1, wherein the antenna is configured as a planar inverted-F antenna.

Item 15 is an ear-worn electronic device configured to be worn by a wearer, comprising:
 a housing configured for at least partial insertion into an ear canal of the wearer, the housing having a preformed shape that conforms to a shape of the wearer's ear canal;
 a processor disposed in the housing;
 a speaker or a receiver operably coupled to the processor;
 a radio frequency transceiver disposed in the housing and operably coupled to the processor; and
 an antenna operably coupled to the transceiver and comprising:
  a radiating element;
  a ground plane; and
  a substrate disposed between the radiating element and the ground plane, the substrate comprising a dielectric gel or a dielectric liquid.

Item 16 is the device of item 15, wherein:
 the housing comprises a faceplate; and
 the antenna is supported by or integral to the faceplate.

Item 17 is the device of item 15, wherein the device is configured as an in-the-ear (ITE), in-the-canal (ITC), invisible-in-canal (IIC) or completely-in-the-canal (CIC) device.

Item 18 is the device of item 15, wherein the dielectric gel or the dielectric liquid comprises water, graphite, ground glass, graphite, titanium dioxide, barium titanate, of barium strontium titanate, or a combination of any of these materials.

Item 19 is the device of item 15, wherein the transceiver and the antenna are configured to operate within a 2.4 GHz ISM frequency band.

Item 20 is an ear-worn electronic hearing device configured to be worn by a wearer and comprising a patch-type antenna, the antenna comprising:
 a radiating element;
 a ground plane; and
 a substrate disposed between the radiating element and the ground plane, the substrate comprising one or both of a dielectric gel and a dielectric liquid.

Item 21 is the device of item 20, wherein the device is configured as an in-the-ear (ITE), in-the-canal (ITC), invisible-in-canal (IIC) or completely-in-the-canal (CIC) device.

Item 22 is the device of item 20, wherein the one or both of the dielectric gel and the dielectric liquid comprises water, graphite, ground glass, graphite, titanium dioxide, barium titanate, of barium strontium titanate, or a combination of any of these materials.

Item 23 is the device of item 20, wherein the antenna is configured to operate within a 2.4 GHz ISM frequency band.

Although reference is made herein to the accompanying set of drawings that form part of this disclosure, one of at least ordinary skill in the art will appreciate that various adaptations and modifications of the embodiments described herein are within, or do not depart from, the scope of this disclosure. For example, aspects of the embodiments described herein may be combined in a variety of ways with each other. Therefore, it is to be understood that, within the scope of the appended claims, the claimed invention may be practiced other than as explicitly described herein.

All references and publications cited herein are expressly incorporated herein by reference in their entirety into this disclosure, except to the extent they may directly contradict this disclosure. Unless otherwise indicated, all numbers expressing feature sizes, amounts, and physical properties used in the specification and claims may be understood as being modified either by the term "exactly" or "about." Accordingly, unless indicated to the contrary, the numerical parameters set forth in the foregoing specification and attached claims are approximations that can vary depending upon the desired properties sought to be obtained by those skilled in the art utilizing the teachings disclosed herein or, for example, within typical ranges of experimental error.

The recitation of numerical ranges by endpoints includes all numbers subsumed within that range (e.g. 1 to 5 includes 1, 1.5, 2, 2.75, 3, 3.80, 4, and 5) and any range within that range. Herein, the terms "up to" or "no greater than" a number (e.g., up to 50) includes the number (e.g., 50), and the term "no less than" a number (e.g., no less than 5) includes the number (e.g., 5).

The terms "coupled" or "connected" refer to elements being attached to each other either directly (in direct contact with each other) or indirectly (having one or more elements between and attaching the two elements). Either term may be modified by "operatively" and "operably," which may be used interchangeably, to describe that the coupling or connection is configured to allow the components to interact to carry out at least some functionality (for example, a radio chip may be operably coupled to an antenna element to provide a radio frequency electromagnetic signal for wireless communication).

Terms related to orientation, such as "top," "bottom," "side," and "end," are used to describe relative positions of components and are not meant to limit the orientation of the embodiments contemplated. For example, an embodiment described as having a "top" and "bottom" also encompasses embodiments thereof rotated in various directions unless the content clearly dictates otherwise.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure.

Furthermore, the particular features, configurations, compositions, or characteristics may be combined in any suitable manner in one or more embodiments.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the disclosure.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

As used herein, "have," "having," "include," "including," "comprise," "comprising" or the like are used in their open-ended sense, and generally mean "including, but not limited to." It will be understood that "consisting essentially of," "consisting of," and the like are subsumed in "comprising," and the like. The term "and/or" means one or all of the listed elements or a combination of at least two of the listed elements.

The phrases "at least one of," "comprises at least one of," and "one or more of" followed by a list refers to any one of the items in the list and any combination of two or more items in the list.

What is claimed is:

1. An ear-worn electronic device configured to be worn by a wearer, comprising:
    a housing configured to be supported at, by, in or on the wearer's ear;
    a processor disposed in the housing;
    a speaker or a receiver operably coupled to the processor;
    a radio frequency transceiver disposed in the housing and operably coupled to the processor; and
    an antenna disposed on or in the housing and operably coupled to the transceiver, the antenna comprising:
        a radiating element;
        a ground plane; and
        a substrate disposed between the radiating element and the ground plane, the substrate configured to contain and distribute a dielectric gel or a dielectric liquid.

2. The device of claim 1, wherein the substrate comprises:
    a first solid substrate;
    a second solid substrate; and
    an interposing substrate disposed between the first and second solid substrates, the interposing substrate containing the dielectric gel or the dielectric liquid.

3. The device of claim 1, wherein the substrate comprises a plurality of channels each containing the dielectric gel or the dielectric liquid.

4. The device of claim 3, wherein the plurality of channels are fluidically isolated from one another.

5. The device of claim 3, wherein the plurality of channels are fluidically coupled to one another.

6. The device of claim 1, wherein the substrate comprises:
    a plurality of edge surfaces and a plurality of channels;
    each of the channels having a first end originating at one of the edge surfaces; and
    each of the channels having a second end terminating at a fluidic junction positioned away from the edge surfaces.

7. The device of claim 1, wherein:
    the substrate comprises a plurality of channels;
    at least a first channel of the plurality of channels contains a first dielectric gel or a first dielectric liquid having a first dielectric constant; and
    at least a second channel of the plurality of channels contains a second dielectric gel or a second dielectric liquid having a second dielectric constant differing from the first dielectric constant.

8. The device of claim 1, wherein:
    the antenna is designed to resonate at a specified operating frequency or band of frequencies in response to the substrate having a predetermined dielectric constant; and
    the dielectric gel or the dielectric liquid has a dielectric constant that allows the substrate to achieve the predetermined dielectric constant.

9. The device of claim 1, wherein the dielectric gel or the dielectric liquid has a dielectric constant in the range from about 5 to about 200.

10. The device of claim 1, wherein the dielectric gel or the dielectric liquid has a dielectric constant of at least 80.

11. The device of claim 1, wherein the dielectric gel or the dielectric liquid comprises water, graphite, ground glass, graphite, titanium dioxide, barium titanate, of barium strontium titanate, or a combination of any of these materials.

12. The device of claim 1, wherein the transceiver and the antenna are configured to operate within a 2.4 GHz ISM frequency band.

13. The device of claim 1, wherein the antenna is configured as a patch-type antenna.

14. The device of claim 1, wherein the antenna is configured as a planar inverted-F antenna.

15. An ear-worn electronic device configured to be worn by a wearer, comprising:
a housing configured for at least partial insertion into an ear canal of the wearer, the housing having a preformed shape that conforms to a shape of the wearer's ear canal;
a processor disposed in the housing;
a speaker or a receiver operably coupled to the processor;
a radio frequency transceiver disposed in the housing and operably coupled to the processor; and
an antenna operably coupled to the transceiver and comprising:
a radiating element;
a ground plane; and
a substrate disposed between the radiating element and the ground plane, the substrate configured to contain and distribute a dielectric gel or a dielectric liquid.

16. The device of claim 15, wherein:
the housing comprises a faceplate; and
the antenna is supported by or integral to the faceplate.

17. The device of claim 15, wherein the device is configured as an in-the-ear (ITE), in-the-canal (ITC), invisible-in-canal (IIC) or completely-in-the-canal (CIC) device.

18. The device of claim 15, wherein the dielectric gel or the dielectric liquid comprises water, graphite, ground glass, graphite, titanium dioxide, barium titanate, of barium strontium titanate, or a combination of any of these materials.

19. The device of claim 15, wherein the transceiver and the antenna are configured to operate within a 2.4 GHz ISM frequency band.

20. An ear-worn electronic hearing device configured to be worn by a wearer and comprising a patch-type antenna, the antenna comprising:
a radiating element;
a ground plane; and
a substrate disposed between the radiating element and the ground plane, the substrate configured to contain and distribute one or both of a dielectric gel and a dielectric liquid.

21. The device of claim 20, wherein the device is configured as an in-the-ear (ITE), in-the-canal (ITC), invisible-in-canal (IIC) or completely-in-the-canal (CIC) device.

22. The device of claim 20, wherein the one or both of the dielectric gel and the dielectric liquid comprises water, graphite, ground glass, graphite, titanium dioxide, barium titanate, of barium strontium titanate, or a combination of any of these materials.

23. The device of claim 20, wherein the antenna is configured to operate within a 2.4 GHz ISM frequency band.

* * * * *